(12) United States Patent
Boller et al.

(10) Patent No.: US 6,660,956 B1
(45) Date of Patent: Dec. 9, 2003

(54) METHOD OF AND APPARATUS FOR MONITORING A BALL FORMING PROCESS

(75) Inventors: Michael Armin Boller, Singapore (SG); Yam Mo Wong, Singapore (SG); Baskaran Annamalai, Singapore (SG); Honghai Zhu, Singapore (SG)

(73) Assignee: ASM Technology Singapore PTE (SG)

( * ) Notice: Subject to any disclaimer, the term of this patent is extended or adjusted under 35 U.S.C. 154(b) by 0 days.

(21) Appl. No.: 10/049,163

(22) PCT Filed: Jun. 13, 2000

(86) PCT No.: PCT/SG00/00087

§ 371 (c)(1),
(2), (4) Date: Feb. 7, 2002

(87) PCT Pub. No.: WO01/97256

PCT Pub. Date: Dec. 20, 2001

(51) Int. Cl.⁷ .......................... B23K 11/16; B23K 31/02; B23K 37/00
(52) U.S. Cl. ................ 219/56.21; 219/56.1; 219/56.22; 219/102; 219/103; 228/180.5; 228/4.5
(58) Field of Search ............................. 228/180.5, 4.5, 228/102, 103; 219/56.1, 56.21, 56.22, 121.54, 121.57

(56) References Cited

U.S. PATENT DOCUMENTS

| | | | | |
|---|---|---|---|---|
| 3,579,029 A | * | 5/1971 | Spescha ...................... 315/127 |
| 4,459,452 A | * | 7/1984 | Carter ....................... 219/56.21 |
| 4,663,515 A | * | 5/1987 | Kneeland et al. ...... 219/121.54 |
| 4,766,286 A | * | 8/1988 | Iceland ................... 219/121.57 |
| 4,889,274 A | * | 12/1989 | Ramsey ..................... 228/180.5 |
| 5,001,326 A | * | 3/1991 | Stava ..................... 219/137 PS |
| 5,043,557 A | * | 8/1991 | Tabata et al. ........... 219/130.51 |
| 5,247,155 A | * | 9/1993 | Steen et al. ............. 219/121.83 |
| 5,463,197 A | * | 10/1995 | Miyazaki ................. 219/56.22 |
| 5,763,849 A | * | 6/1998 | Nakao ..................... 219/56.21 |
| 6,320,155 B1 | * | 11/2001 | Barnett .................. 219/121.46 |
| 6,420,863 B1 | * | 7/2002 | Milde et al. ................. 370/337 |

FOREIGN PATENT DOCUMENTS

| | | |
|---|---|---|
| JP | 02045944 | 2/1990 |
| JP | 03068148 | 3/1991 |
| JP | 06333971 | 12/1994 |
| JP | 09-64083 A | * 3/1997 |
| JP | 11102930 | 4/1999 |

OTHER PUBLICATIONS

PCT Search Report mailed Feb. 28, 2002 for application PCT/SG 00/00087.

* cited by examiner

*Primary Examiner*—Tom Dunn
*Assistant Examiner*—L. Edmondson
(74) *Attorney, Agent, or Firm*—Ostrolenk, Faber, Gerb & Soffen, LLP

(57) ABSTRACT

A method of monitoring a ball forming process in a wire bonder. A glow discharge parameter between an electrode on the wire bonder and an end of a wire mounted on the wire bonder on which the ball is being formed is monitored. The monitored parameter is compared with a reference value to determine whether the ball formed is satisfactory.

10 Claims, 2 Drawing Sheets

Undistorted waveform $$A_s = \int_0^{T_s} (U_G - U_C)(t)\, dt$$

Distorted waveform

METHOD OF AND APPARATUS FOR MONITORING A BALL FORMING PROCESS

The invention relates to a method of and apparatus for monitoring a ball forming process and in particular, a ball forming process where a ball of metal is formed at the end of a wire in a wire bonder.

During assembly of semiconductor packages, a thin metal wire is ultrasonically welded to a contact pad on a semiconductor die and to a corresponding contact on a leadframe on which the die is mounted to establish an electrical connection between the pad and the corresponding contact on the leadframe. This is commonly known as the wire bonding process and is carried out using a wire bonder. The wire is held in the wire bonder in a work piece known as a capillary and the wire extends through a central bore of the capillary. The capillary holds the wire during bonding and couples the ultrasonic energy to the wire to ultrasonically weld the wire to the contact on the die (commonly known as the die pad) or the contact on the leadframe.

Normally, the end of the wire is bonded to the die pad before the wire is bonded to the contact on the leadframe. Prior to bonding the wire to the die pad, a ball of metal is formed at the end of the wire by a glow discharge between the end of the wire and an electrode on the wire bonder. The glow discharge causes the tip of the wire to melt and surface tension effects cause the molten metal to form a ball on the end of the wire. It is important that the ball that is formed is of the correct size to ensure a satisfactory bond to the die pad. After the ball is formed, the wire is pulled back up into the capillary so that the ball is at the capillary tip. This is to ensure rigidity between the ball and the capillary tip and to enable efficient coupling of ultrasonic power from the capillary to the ball during the ultrasonic welding process. Under normal conditions, a proper ball will be formed to a size determined by the current during the glow discharge and the duration of the glow discharge.

However, it is possible that either the wire or the electrode may be contaminated by substances that cause an irregular glow discharge. For example, the electrode may be contaminated by using it for a very long time, such that substances are deposited at the end of the capillary tip, or by touching it with bare fingers or other objects. The wire may be contaminated by a contaminated wire path, insufficiently purified air or by substances which are picked up from the substrate on which the second bond is made, especially when the substrate is of a non-metallic nature. Although the die pad is metallic, this may be contaminated by non-metallic substances, such as PCB material. Such contamination may result in variations of the ball size. In addition, when the length of wire protruding from the capillary tip is too short or too long, or when the wire end is bent at an irregular angle, the ball size may also be affected.

When the ball is too small, the edge of the capillary will leave a mark on the die when it touches down. This is normally referred to as a "capillary mark" or, in short, a "cap mark". Devices with cap marks normally have to be discarded, as the proper functioning of that particular die cannot be guaranteed. This causes loss of yield and may, especially for very large scale integration (VLSI) devices, result in appreciable financial loss.

In accordance with the present invention, a method of monitoring a ball forming process in a wire bonder comprises monitoring the glow discharge between an electrode on the wire bonder and an end of a wire mounted on the wire bonder on which the ball is being formed, and comparing a parameter of the glow discharge with a reference value.

In accordance with a second aspect of the present invention, apparatus for monitoring the formation of a ball on an end of a wire in a wire bonder comprises a detector to detect a parameter of a glow discharge between an electrode on the wire bonder and the end of a wire during the ball formation process, and a processor coupled to the detector to receive an output signal from the detector, the processor comparing the output signal with a reference value.

An advantage of the invention is that by monitoring a parameter of the glow discharge, it is possible to obtain an indication of whether the ball formed is of the correct size.

Preferably, the parameter is the glow discharge voltage. However, it is possible that the parameter could be the glow discharge current.

In one example of the invention, the ball formation process is divided into a number of time intervals and the glow discharge parameter during each time interval is integrated over the time interval, and for each time interval each integrated value is compared with a reference value.

Preferably, the processor may also determine the mean value of the glow discharge parameter during the ball formation process and compare the mean value with a reference value.

The method comprises the step to stop the automatic bonding process and provide information to the operator about the nature of the fault if the processor detects that the glow discharge parameter is out of a reference value. Alternatively, a dummy bond may be performed, in which case the automatic bonding process does not need to be interrupted.

BRIEF DESCRIPTION OF THE DRAWINGS

An example of a method of and apparatus for monitoring formation of a ball at the end of a wire in a wire bonder will now be described with reference to the accompanying drawings, in which:

FIG. 1 shows a wire 5 that is connected to an output from a voltage detector (not shown). The wire 5 is coupled to a two-way switch 4 that is controlled by a processor 3 via a control wire 2. The processor 3 may switch the switch 4 to either a contact 6, which is coupled to a first integrator 8, or to a contact 7, which is coupled to a second integrator 9. Both the integrators 8, 9 have outputs, which are coupled to an analog digital converter (ADC) 10 and the output from the ADC 10 is coupled to the processor 3. The processor 3 can also reset the integrators 8, 9 via reset lines 11, 12 respectively. The processor 3 is also coupled to an electrically erasable programmable read only memory (EEPROM) 13 and the processor 3 includes a random access memory (RAM) 14. An output 15 from the processor 3 is coupled to a communication interface (not shown) which permits the processor 3 to communicate with a main processor (not shown) for a wire bonder on which the apparatus 1 is used to monitor the formation of a ball at the end of a wire in a capillary on the wire bonder.

Figure 2:
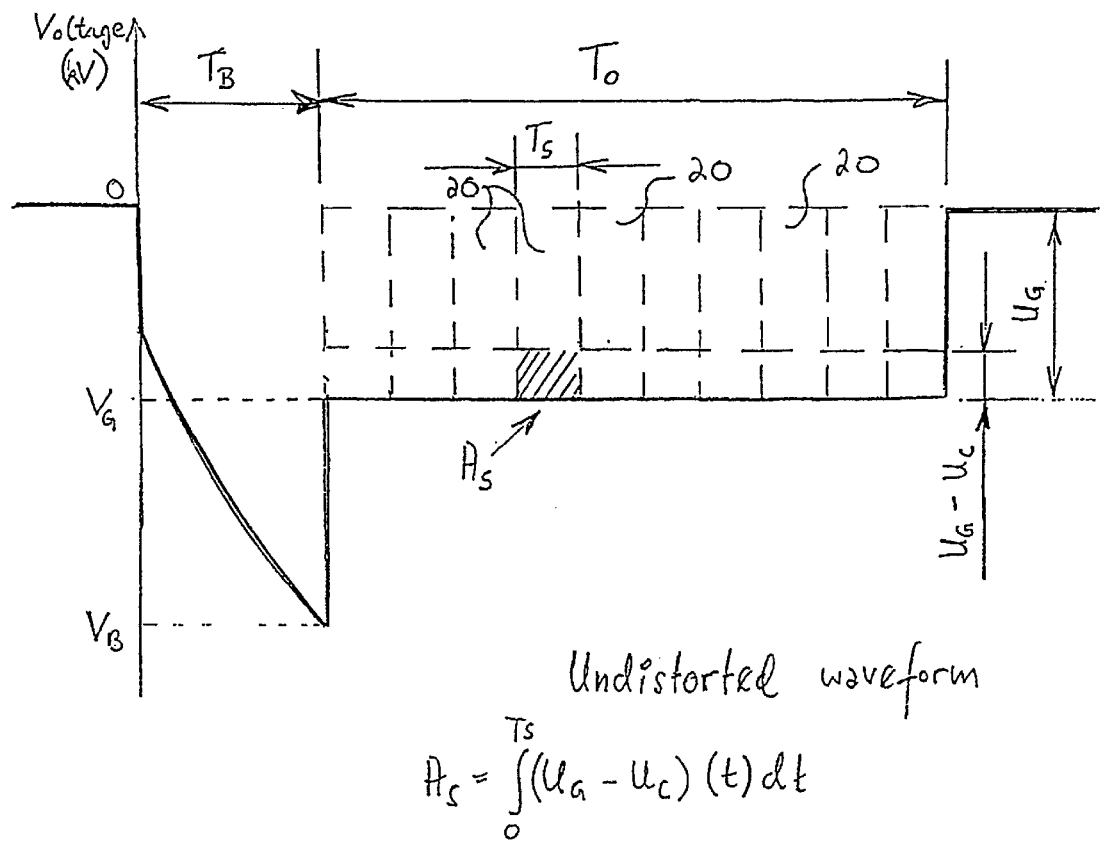
FIG. 2 is a graph of voltage versus time for formation of an ideal ball.
Figure 3:
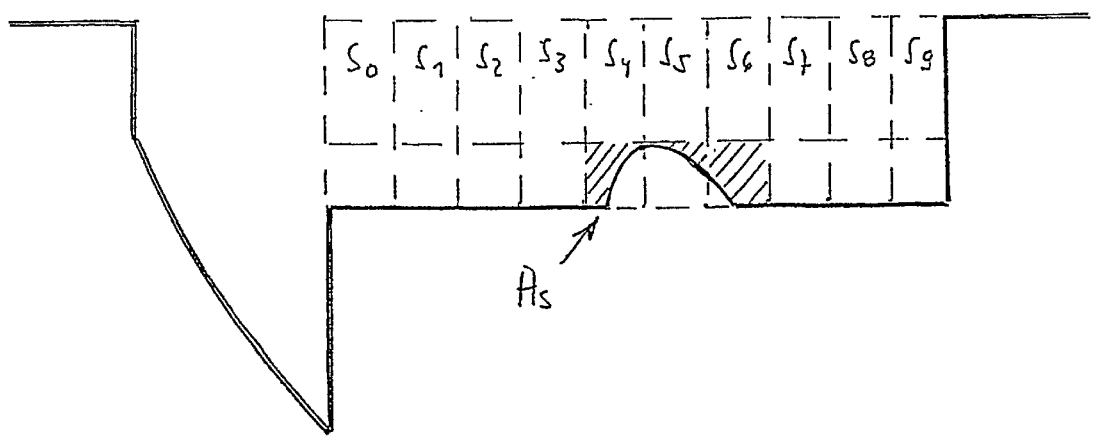
FIG. 3 is a graph of voltage versus time for formation of a non-perfect ball.

A typical ideal voltage versus time waveform for a ball formation process is shown in FIG. 2. Initially, a negative voltage is applied between a discharge electrode on the wire bonder and the end of the wire in the capillary in the wire bonder and the negative voltage is increased until breakdown occurs. The typical breakdown voltage (BB) is normally in the region of approximately −3 kV to −4 kV but can be as high as −5 kV. When breakdown occurs, the voltage immediately drops, as a glow discharge is setup between the end of the wire and the electrode. The typical glow discharge voltage ($V_G$) is normally approximately −400 V with a corresponding current of approximately −30 mA for normal gauge wire, which is typically 25 μm to 32 μm diameter. For heavy-duty wire, the current may be up to 200 mA for wire having a 75 μm diameter. The glow discharge voltage ($V_G$) is sustained for a given time interval ($T_O$) to form a ball at the end of the wire, the voltage is then returned to zero to stop the glow discharge process.

As shown in FIG. 2, the glow discharge time interval ($T_O$) is split into a number of time intervals ($T_S$) 20. The processor 3 controls the switch 4 so that the switch 4 is coupled to the contact 6 and the contact 7 alternatively, for each of the time intervals ($T_S$). Therefore, for each time interval ($T_S$), the respective integrator 8, 9 integrates the output voltage 5. At the end of the time interval, the processor 3 switches the switch 4 to the other contact 7 and the integrator 8 ouputs the result of the integration to the ADC 10 for conversion to a digital signal which is then output to the processor 3. After the processor 3 receives the digitally converted output from the integrator 8, the processor 3 resets the integrator 8 using the reset line 11. While this is happening, the integrator 9 has integrated the voltage ($V_G$) over the next time interval 20 and at the end of the next time interval 20, the processor 3 switches the switch 4 back to the contact 6 and the integrator 9 outputs the result of the integration to the ADC 10 for conversion to a digital signal which is then output to the processor 3, and the processor 3 then resets the integrator 9. This process continues until the end of the glow discharge period.

When the glow discharge is finished, the processor 3 compares each of the integrated voltages for each time interval 20 with a reference value and also calculates the mean value of the integrated voltages and compares this with another reference value. If the actual mean value or any of the individual integrated values are out with a predetermined deviation from the reference values, the processor 3 outputs an error message on the serial link 15 to the bonder. The reference values can be obtained using a trial bonding process and can be stored in the EEPROM 13.

In response to an error output signal from the apparatus 1, the bonder can download all the individual integrated values from the apparatus 1 for further processing and analysis and/or can perform a dummy bond on a dummy die pad if necessary.

Figure 1:
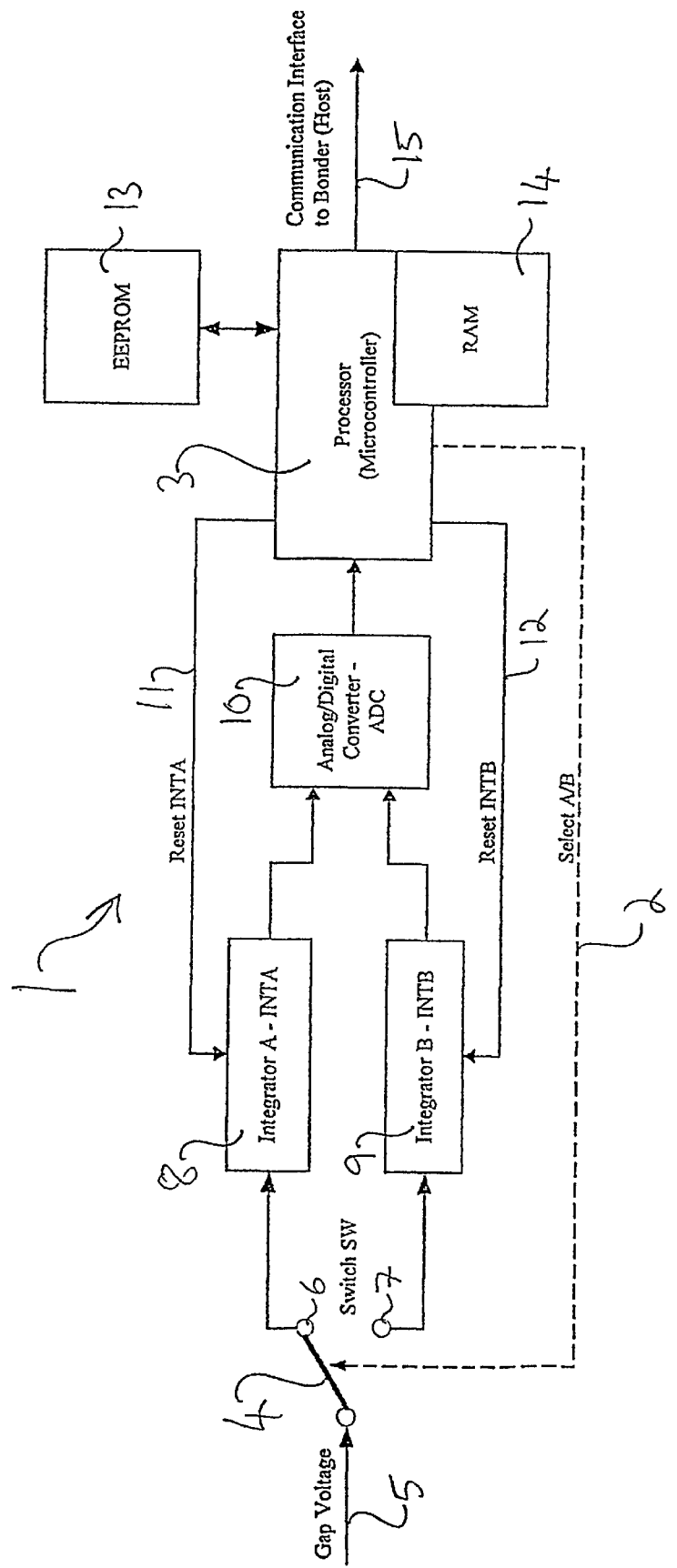
FIG. 1 is a block diagram of apparatus for monitoring formation of a ball.

As an alternative to the apparatus shown in FIG. 1, if a fast ADC 10 is used and a processor 3 which can sample at small time intervals, such as a digital signal processor, it may not be necessary to use the integrators 8, 9 and the output 5 from the voltage detector may be fed directly to the ADC 10 and then to the digital signal processor.

An advantage of the invention is that by monitoring the glow discharge voltage, it is possible to obtain an indication of whether the ball formed is of the correct size. Therefore, it is possible to control the bonder to prevent the bonder attempting to bond a ball to a die pad if the ball may be of the incorrect size.

What is claimed is:

1. A method of monitoring a ball forming process in a wire bonder, the method comprising the steps of:

monitoring the glow discharge between an electrode on the wire bonder and an end of a wire mounted on the wire bonder on which the ball is being formed, comparing a parameter of the glow discharge with a reference value; and determining from such comparison whether the ball formed is of a correct size.

2. A method according to claim 1, wherein the parameter is the glow discharge voltage.

3. A method according to claim 1, wherein the parameter is the glow discharge current.

4. A method according to claim 1, further comprising interrupting the automatic bonding process or performing a dummy bond if the glow discharge parameter differs significantly from the reference value.

5. A method according to any of the preceding claims, wherein the ball formation process is divided into a number of time intervals and the glow discharge parameter during each time interval is integrated over each time interval, and for each time interval each integrated value is compared with a first reference value.

6. A method according to claim 1, wherein the mean value of the glow discharge parameter during the ball formation process is determined and the mean value is compared with a second reference value.

7. Apparatus for monitoring the formation of a bail on an end of a wire in a wire bonder comprising:

a detector which is operative to detect a parameter of a glow discharge between an electrode on the wire bonder and an end of a wire during the bail formation of a ball; and a signal processor coupled to the detectors, the signal processor being operative to compare an output signal from the detector with a reference value, and to determine from such comparison whether the ball formed is of a correct size.

8. Apparatus according to claim 7, further comprising an integrator to integrate the parameter over a time interval.

9. Apparatus according to claim 8, wherein the glow discharge is divided into a number of time intervals and the integrator integrates the parameter over each time interval, and the signal processor compares each integrated value with the reference value.

10. Apparatus according to claim 8, wherein the apparatus comprises two integrators, each integrator integrating the parameter over alternate time intervals.

* * * * *